(12) United States Patent
Dyer et al.

(10) Patent No.: US 9,276,111 B2
(45) Date of Patent: Mar. 1, 2016

(54) SEMICONDUCTOR DEVICES HAVING TENSILE AND/OR COMPRESSIVE STRESS AND METHODS OF MANUFACTURING

(71) Applicant: INTERNATIONAL BUSINESS MACHINES CORPORATION, Armonk, NY (US)

(72) Inventors: Thomas W. Dyer, Pleasant Valley, NY (US); Haining S. Yang, San Diego, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/516,000

(22) Filed: Oct. 16, 2014

(65) Prior Publication Data
US 2015/0037957 A1  Feb. 5, 2015

Related U.S. Application Data

(63) Continuation of application No. 13/364,753, filed on Feb. 2, 2012, now Pat. No. 8,889,504, which is a continuation of application No. 12/047,376, filed on Mar. 13, 2008, now Pat. No. 8,293,631.

(51) Int. Cl.
| | |
|---|---|
| *H01L 21/8238* | (2006.01) |
| *H01L 29/78* | (2006.01) |
| *H01L 21/02* | (2006.01) |
| *H01L 29/49* | (2006.01) |
| *H01L 29/66* | (2006.01) |

(Continued)

(52) U.S. Cl.
CPC ........ *H01L 29/7846* (2013.01); *H01L 21/0217* (2013.01); *H01L 21/02164* (2013.01); *H01L 21/02529* (2013.01); *H01L 21/02532* (2013.01); *H01L 21/02664* (2013.01); *H01L 21/823807* (2013.01); *H01L 21/823842* (2013.01); *H01L 27/092* (2013.01); *H01L 29/16* (2013.01); *H01L 29/167* (2013.01); *H01L 29/4916* (2013.01); *H01L 29/6656* (2013.01); *H01L 29/7843* (2013.01); *H01L 29/7845* (2013.01)

(58) Field of Classification Search
None
See application file for complete search history.

(56) References Cited

U.S. PATENT DOCUMENTS

| | | |
|---|---|---|
| 5,827,747 A | 10/1998 | Wang et al. |
| 6,165,826 A | 12/2000 | Chau et al. |

(Continued)

OTHER PUBLICATIONS

Office Action dated Apr. 24, 2015 in related U.S. Appl. No. 14/515,981, 16 pages.

(Continued)

*Primary Examiner* — Evan Pert
*Assistant Examiner* — Leslie Pilar Cruz
(74) *Attorney, Agent, or Firm* — Yuanmin Cai; Andrew M. Calderon; Roberts Mlotkowski Safran & Cole, P.C.

(57) ABSTRACT

Semiconductor devices are provided which have a tensile and/or compressive strain applied thereto and methods of manufacturing. A method of forming a semiconductor structure includes forming sidewalls and spacers adjacent to a gate stack structure, and forming a recess in the gate stack structure. The method further includes epitaxially growing a straining material on a polysilicon layer of the gate stack structure, and in the recess in the gate stack structure. The straining material is Si:C and the gate stack structure is a PFET gate stack structure. The straining material is grown above and covering a top surface of the sidewalls and the spacers.

17 Claims, 10 Drawing Sheets

(51) Int. Cl.
*H01L 27/092* (2006.01)
*H01L 29/16* (2006.01)
*H01L 29/167* (2006.01)

(56) References Cited

U.S. PATENT DOCUMENTS

| | | | |
|---|---|---|---|
| 6,872,625 B2 | 3/2005 | Schmidt et al. | |
| 7,217,603 B2 | 5/2007 | Currie et al. | |
| 7,462,524 B1 | 12/2008 | Peidous et al. | |
| 8,889,504 B2 * | 11/2014 | Dyer et al. | 438/199 |
| 8,896,069 B2 | 11/2014 | Dyer et al. | |
| 2003/0148563 A1 | 8/2003 | Nishiyama | |
| 2005/0236668 A1 | 10/2005 | Zhu et al. | |
| 2006/0194387 A1 | 8/2006 | Wang et al. | |
| 2006/0199285 A1 * | 9/2006 | Chidambaram et al. | 438/14 |
| 2006/0234455 A1 | 10/2006 | Chen et al. | |
| 2007/0032003 A1 * | 2/2007 | Zhang et al. | 438/197 |
| 2007/0057324 A1 | 3/2007 | Tews et al. | |
| 2008/0009110 A1 | 1/2008 | Chang et al. | |
| 2008/0102634 A1 * | 5/2008 | Pas et al. | 438/692 |
| 2008/0119019 A1 | 5/2008 | Han et al. | |

OTHER PUBLICATIONS

Office Action dated Nov. 9, 2015 in related U.S. Appl. No. 14/515,981, 11 pages.

* cited by examiner

SEMICONDUCTOR DEVICES HAVING TENSILE AND/OR COMPRESSIVE STRESS AND METHODS OF MANUFACTURING

FIELD OF THE INVENTION

The present invention generally relates to semiconductor devices and methods of manufacturing the same, and more specifically, to semiconductor devices having a tensile and/or compressive strain applied thereto and methods of manufacturing.

BACKGROUND OF THE INVENTION

Mechanical strains within a semiconductor device substrate can modulate device performance by, for example, increasing the mobility of the carriers in the semiconductor device. That is, strains within a semiconductor device are known to enhance semiconductor device characteristics. Thus, to improve the characteristics of a semiconductor device, tensile and/or compressive strains are created in the channel of the n-type devices (e.g., NFETs) and/or p-type devices (e.g., PFETs), respectively. However, the same strain component, for example tensile strain or compressive strain, improves the device characteristics of one type of device (i.e., n-type device or p-type device) while discriminatively affecting the characteristics of the other type device.

Accordingly, in order to maximize the performance of both NFETs and PFETs within integrated circuit (IC) devices, the strain components should be engineered and applied differently for NFETs and PFETs. That is, because the type of strain which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished.

To selectively create tensile strain in an NFET and compressive strain in a PFET, distinctive processes and different combinations of materials are used. For example, liners on gate sidewalls have been proposed to selectively induce the appropriate strain in the channels of the FET devices. By providing liners the appropriate strain is applied closer to the device. While this method does provide tensile strains to the NFET device and compressive strains along the longitudinal direction of the PFET device, they may require additional materials and/or more complex processing, and thus, result in higher cost. Further, the level of strain that can be applied in these situations is typically moderate (i.e., on the order of 100s of MPa). Thus, it is desired to provide more cost-effective and simplified methods for creating larger tensile and compressive strains in the channels of the NFETs and PFETs, respectively.

Accordingly, there exists a need in the art to overcome the deficiencies and limitations described hereinabove.

SUMMARY OF THE INVENTION

In a first aspect of the invention, a method of forming a semiconductor structure comprises expitaxially growing a straining material on a polysilicon layer of a gate stack structure.

In an additional aspect of the invention, a semiconductor structure comprises an expitaxially grown straining material on a polysilicon layer of a gate stack structure.

In a further aspect of the invention, a structure comprises a gate stack comprising an oxide layer, a polysilicon layer and sidewalls with adjacent spacers. The structure further comprises an epitaxially grown straining material directly on the polysilicon layer and between portions of the sidewalls. The epitaxially grown straining material strains the polysilicon layer.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to semiconductor devices having tensile and/or compressive strains and methods of manufacturing. By implementing the invention, it is possible to increase electron mobility enhancement under a gate to increase device performance, regardless of the scale of the device. More specifically, the invention is directed to semiconductor devices and methods of manufacture which provide tensile strains near the NFET channel and compressive strains near the PFET channel of CMOS devices. In implementation, the present invention can integrate SiGe and Si:C materials into CMOS technology.

Advantageously, the present invention provides a device that, in embodiments, forms a straining cap layer directly on a polysilicon layer of a gate structure. The straining cap layer can be epitaxially grown SiGe or Si:C materials. When epitaxially grown directly on the poly layer of the gate, the SiGe or Si:C layer will have a lattice constant that conforms to that of the underlying polysilicon layer. Upon relaxation, the SiGe lattice constant approaches that of its intrinsic lattice constant which is larger than that of the polysilicon which, in turn, applies physical biaxial strain (e.g., expansion) to the underlying polysilicon layer. This physical strain forms a tensile strain which is beneficial to an N type device performance.

In the case of Si:C, for example, upon relaxation, the lattice constant approaches that of its intrinsic lattice constant which is smaller than that of the underlying polysilicon layer. This, in turn, applies physical biaxial strain (e.g., contraction) to the underlying polysilicon layer. This physical strain forms a compressive strain which is beneficial to P type device performance. In further embodiments, an SiGe material may be provided on sides of a P type device to further improve the performance of such device.

First and Second Aspects of the Invention

Figure 1:
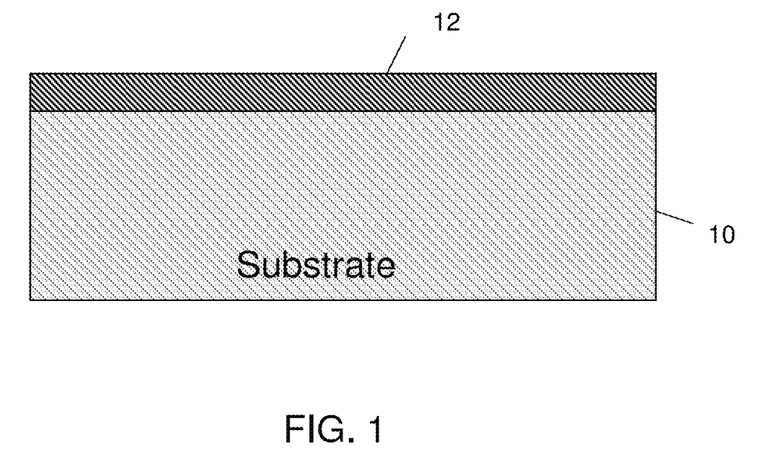
FIGS. 1-8 show structures and respective processing steps for forming a strained device in accordance with aspects of the invention.

FIG. 1 shows a starting structure and respective processing steps for forming a FET in accordance with the invention. The starting structure includes, for example, a gate oxide layer 12 deposited over an active area of a wafer 10 in a conventional deposition process. In one illustrative embodiment, the gate oxide layer 12 can have a thickness ranging from about 10 Å to 20 Å. Although not shown in FIG. 1, it should be understood that shallow trench isolation (STI) structures can be provided on sides of the active region of the wafer 10. The wafer 10 can be any known type of wafer used with the formation of FETs. For example, the wafer 10 can be silicon, BULK, SOI, SiGe or Gallium arsenic, to name a few.

Figure 2:
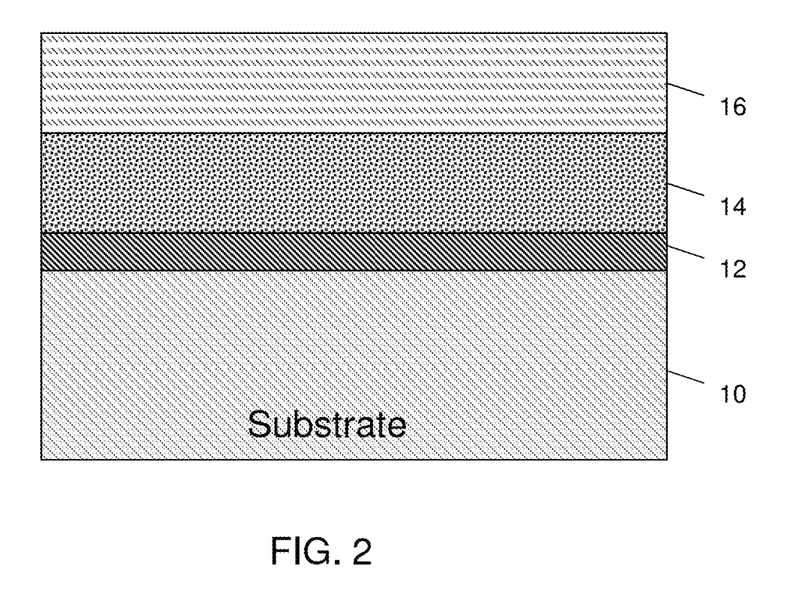

FIG. 2 shows a conventional gate stack deposition process such as, for example, using chemical vapor deposition processes. In particular, a polysilicon material 14 is deposited on the gate oxide layer 12 and a SiGe material 16 is deposited on the polysilicon material 14. In embodiments, the SiGe material is preferred as it can be removed more easily in later processing steps. In embodiments, the gate stack is about 100 nm. In all aspects of the invention, though, it should be understood that the size and location of the gate stack can be varied depending on the technology application.

Figure 3:
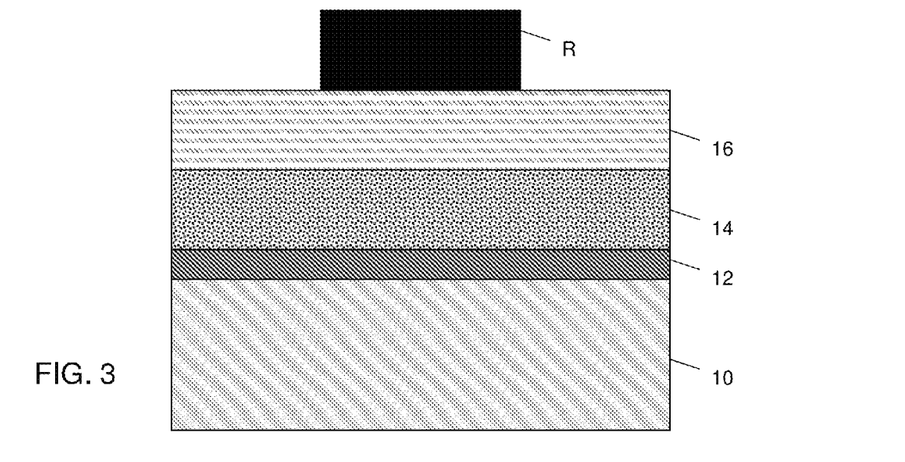
Figure 4:
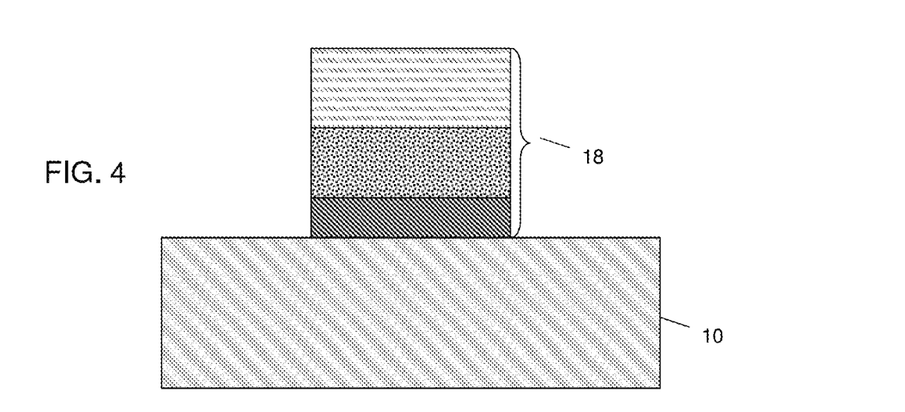

FIGS. 3 and 4 show intermediate structures and respective processing steps in accordance with the invention. More specifically, in FIG. 3, a resist R is deposited on the structure of FIG. 2 and patterned using conventional lithographic processes. By way of illustration, a resist is placed over the structure of FIG. 2 and selective portions of the resist are exposed to form openings. In subsequent processes as shown in FIG. 4, the gate oxide layer 12, polysilicon material 14 and SiGe material 16 are patterned to form a gate stack, generally represented at reference numeral 18.

Figure 5:
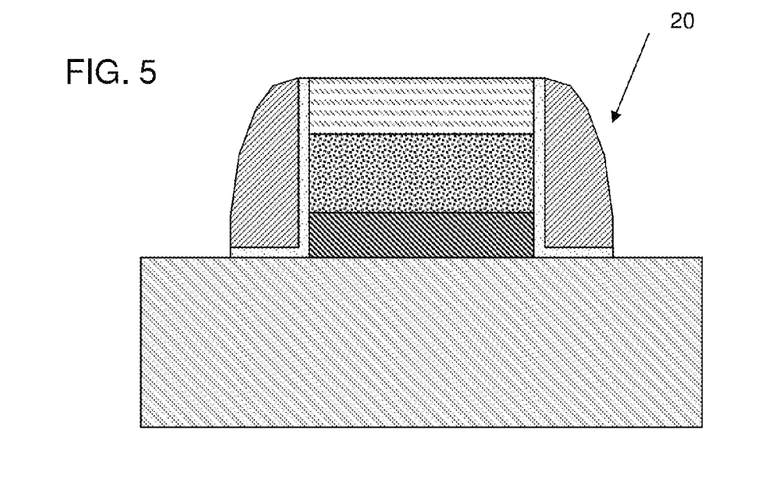

FIG. 5 shows the formation of sidewalls and spacers using conventional processes. The sidewalls and spacers are represented generally by reference numeral 20. In embodiments, the sidewalls are oxide formed during an oxidation process and the spacers are silicon nitride (Si3N4). After the formation of the spacers, a RIE process is used to form the structure 20 shown in FIG. 5. As the formation of the sidewalls and spacers are known to those of skill in the art, a more detailed explanation of such formation is not necessary for the understanding of the invention.

Figure 6:
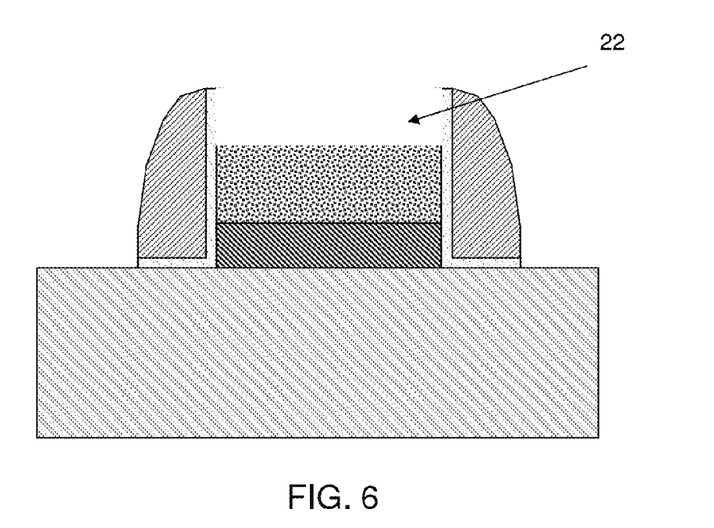

FIG. 6 shows an intermediate structure and respective processing steps in accordance with the invention. More specifically, in FIG. 6, the SiGe material is removed in a conventional selective etching process to form a recess 22 in the gate stack. For example, using either a wet etching or dry etching process, the SiGe material is removed from the gate structure to form the recess 22.

Figure 7:
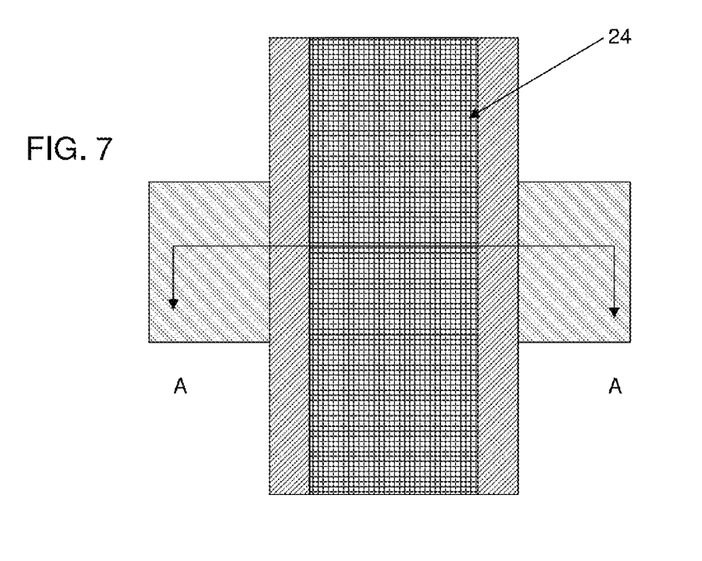
Figure 8:
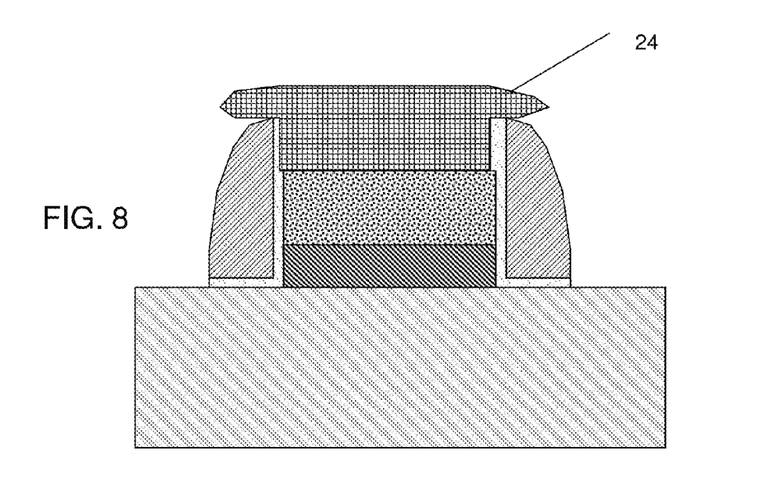

FIG. 7 shows a top view of a final structure and respective processing steps in accordance with the invention. FIG. 8 shows a cross-sectional view of FIG. 7 along lines A-A. As shown in FIGS. 7 and 8, an epitaxially grown strain material 24 is grown in the recess 22 of FIG. 6. The strain material 24 can extend above the structure to a height of about 30 nm to 50 nm; although, in embodiments, the strain material 24 is preferably planar or substantially planar with the surface of the structure. In embodiments, the strain material 24 can be SiGe to provide a tensile strain for an NFET device. Alternatively, the strain material 24 can be Si:C to provide a compressive strain for a PFET device.

As should be understood by those of skill in the art, the SiGe material will provide a tensile stress in the channel of the NFET. More specifically, to increase the strain levels in a NFET device, the epitaxially grown SiGe layer, in an unrelaxed state, will have a lattice constant that conforms to that of the underlying polysilicon layer. Upon relaxation (e.g., through a high temperature process for example), the SiGe lattice constant approaches that of its intrinsic lattice constant which is larger than that of the underlying polysilicon layer. Accordingly, the underlying polysilicon layer conforms to the larger lattice constant of the relaxed SiGe layer which results in a physical biaxial strain (e.g., expansion) to the polysilicon layer. This physical strain applied to the polysilicon layer is beneficial because the expanded polysilicon layer increases N type device performance.

Also, as should be understood by those of skill in the art, the Si:C material will provide a compressive strain in the channel of the PFET. More specifically, to increase the strain levels in a PFET device, the epitaxially grown Si:C layer, in an unrelaxed state, will have a lattice constant that conforms to that of the underlying polysilicon layer. Upon relaxation (e.g., through a high temperature process for example), the Si:C lattice constant approaches that of its intrinsic lattice constant which is smaller than that of the underlying polysilicon layer. Accordingly, the polysilicon layer conforms to the smaller lattice constant of the relaxed Si:C layer which results in a physical biaxial strain (e.g., contraction) to the polysilicon layer. This physical strain applied to the polysilicon layer is beneficial because the contracted polysilicon layer increases P type device performance.

Third Aspect of the Invention

Figure 9:
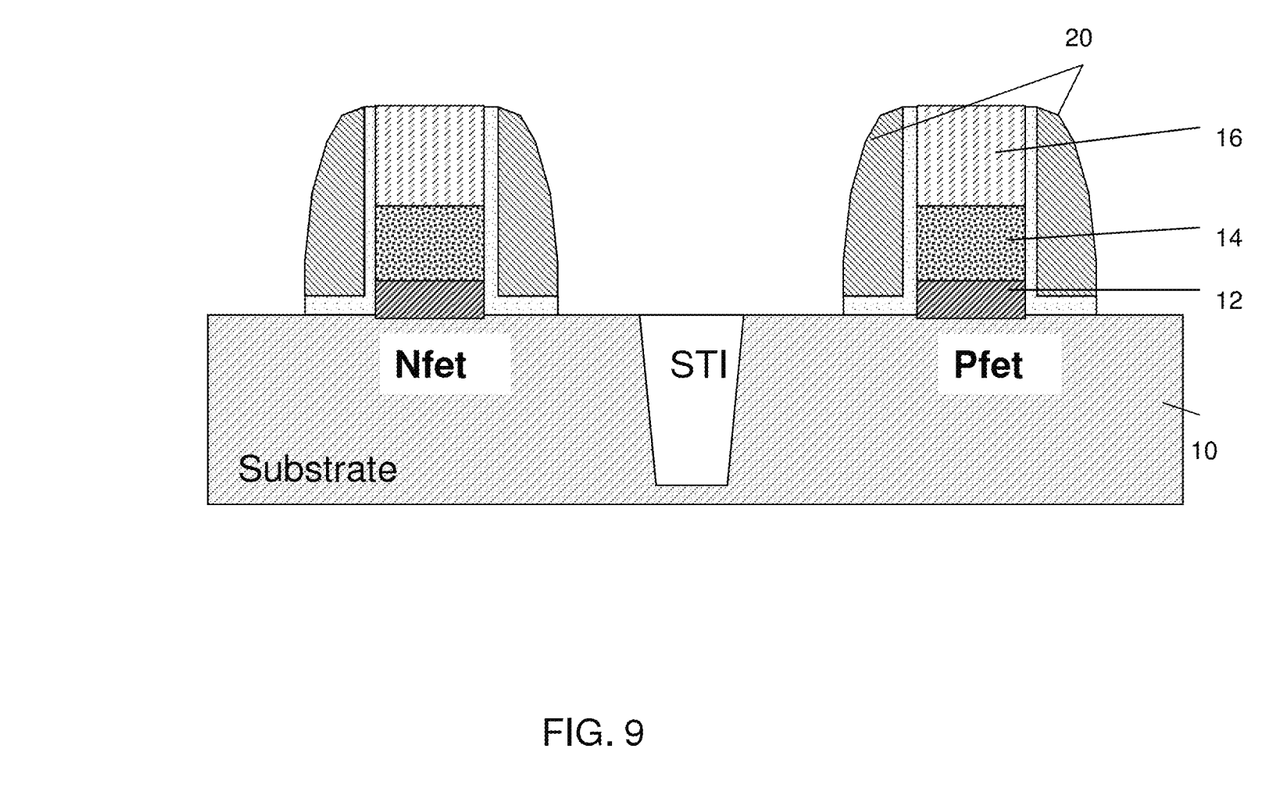
FIGS. 9-19 show structures and respective processing steps for forming a strained device in accordance with another aspect of the invention.

FIG. 9 shows a starting structure in accordance with another aspect of the invention. More particularly, the starting structure of FIG. 9 includes a beginning structure for an NFET and PFET, isolated from one another by an STI structure. The beginning structures for the NFET and PFET are fabricated according to the processes shown in FIGS. 1-5.

More specifically, the STI structure is formed in a conventional manner using photolithographic and etching processes to form a trench. The trench is then filled with an oxide, for example. As to the NFET and PFET structures, a gate oxide layer 12 is deposited over an active area of a wafer 10 in a conventional deposition process (as discussed with reference to FIG. 1). A polysilicon 14 and an SiGe material 16, for example, are deposited over the gate oxide layer 12. A gate stack is then patterned in accordance with the processes shown, for example, in FIGS. 2-4. Sidewalls and spacers 20 are formed using conventional processes as described with reference to FIG. 5.

Figure 10:
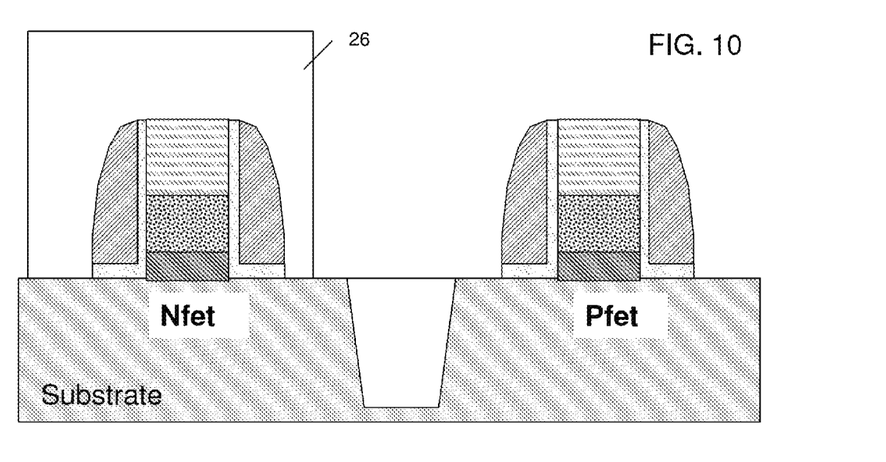
Figure 11:
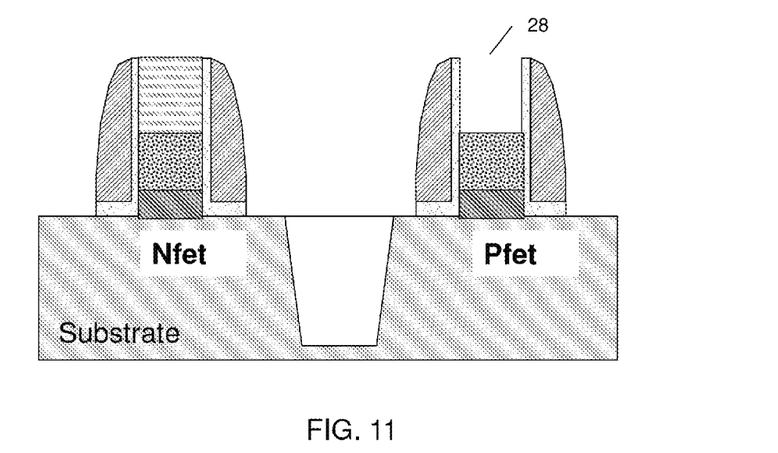

As shown in FIG. 10, a resist 26 is formed over the NFET of FIG. 9. Thereafter, as shown in FIG. 11, an etching process will remove the SiGe layer of the PFET to form a recess 28, as the resist 26 protects the NFET side of the device. The resist 26 is stripped away using a conventional stripping process.

Figure 12:
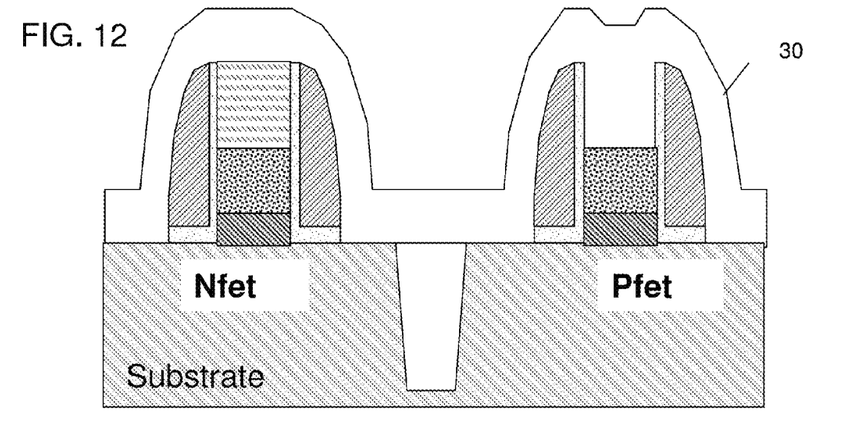
Figure 13:
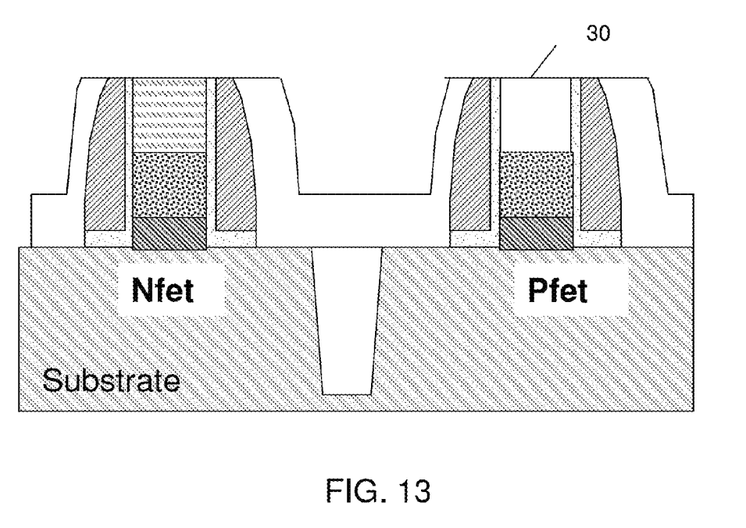

As shown in FIG. 12, an oxide 30 is formed over the structure of FIG. 11. The oxide 30 can be formed using any conventional oxidation process. As shown in FIG. 13, the oxide is planarized using a conventional chemical mechanical polishing process. As shown in FIG. 13, oxide 30 remains within the recess 28 of the PFET.

Figure 14:
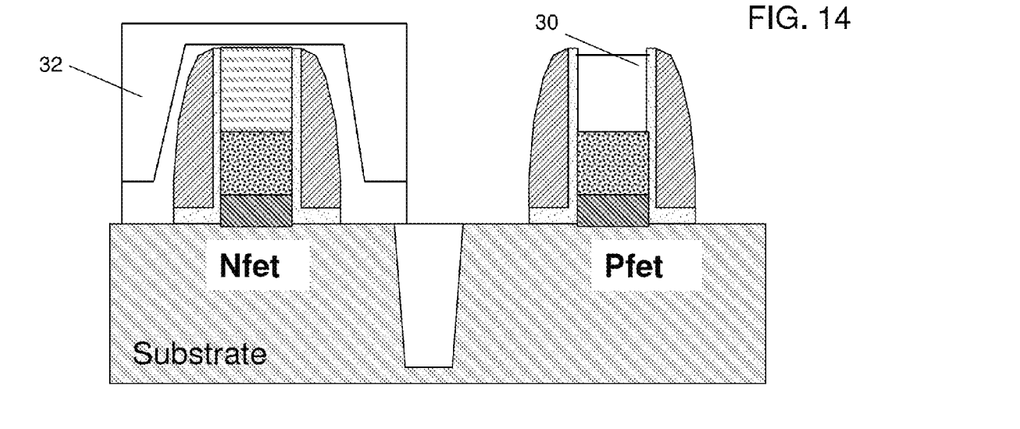

FIG. 14 shows an intermediate structure and respective processing steps in accordance with the invention. More specifically, in FIG. 14, a resist 32 is formed over the NFET structure. An etching process, e.g., SiO2 Reactive Ion Etching (RIE), removes the oxide layer on the wafer and sidewall structure of the PFET.

Figure 15:
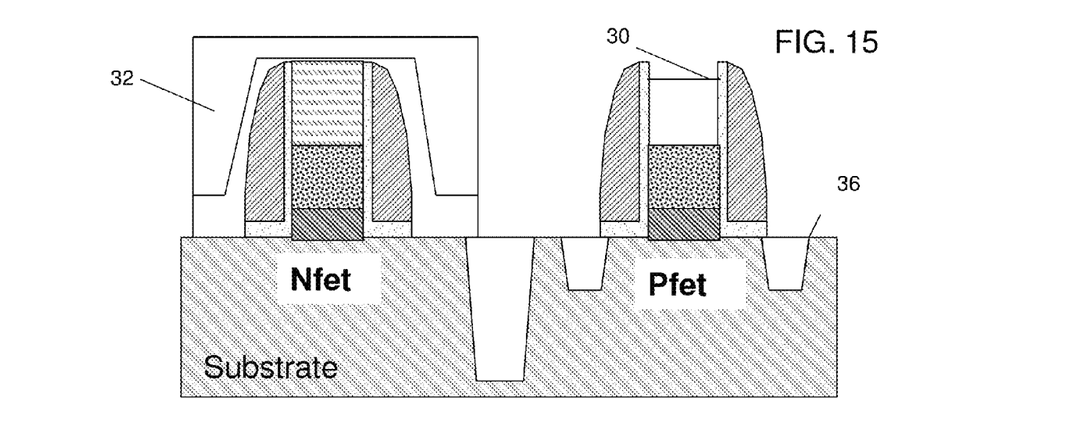

As shown in FIG. 15, recesses 36 are formed in the wafer, e.g., substrate, using a conventional RIE process. The recesses 36 are formed in the source/drain regions of the PFET. During this processing, the NFET structure remains protected by a resist.

Figure 16:
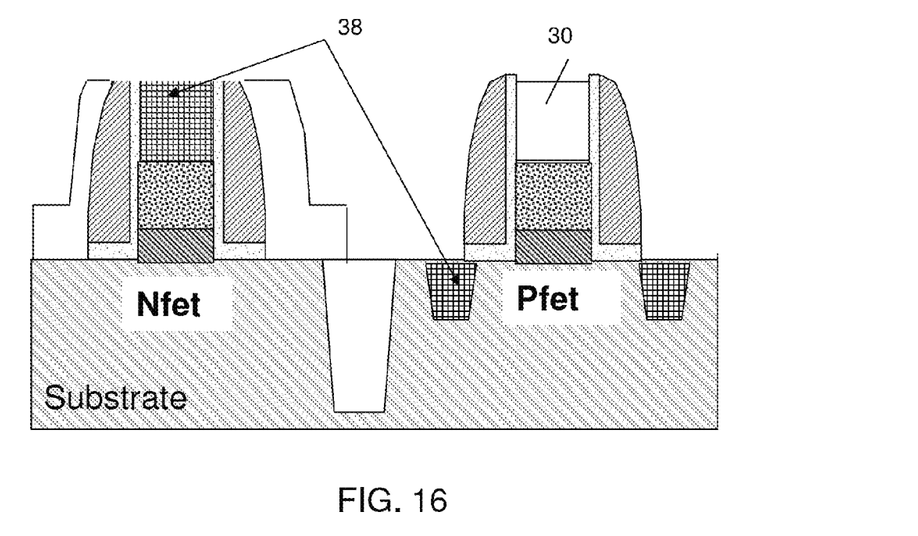

In FIG. 16, the resist and the SiGe layer on the NFET stack are removed using a conventional stripping and etching processes known to those of skill in the art. In further fabrication processes, a SiGe material 38 is epitaxially grown in the recess of the NFET stack and the recesses 36. As discussed above, the epitaxially grown SiGe will create tensile and compressive strains in the channels of the NFET and PFET, respectively.

Figure 17:
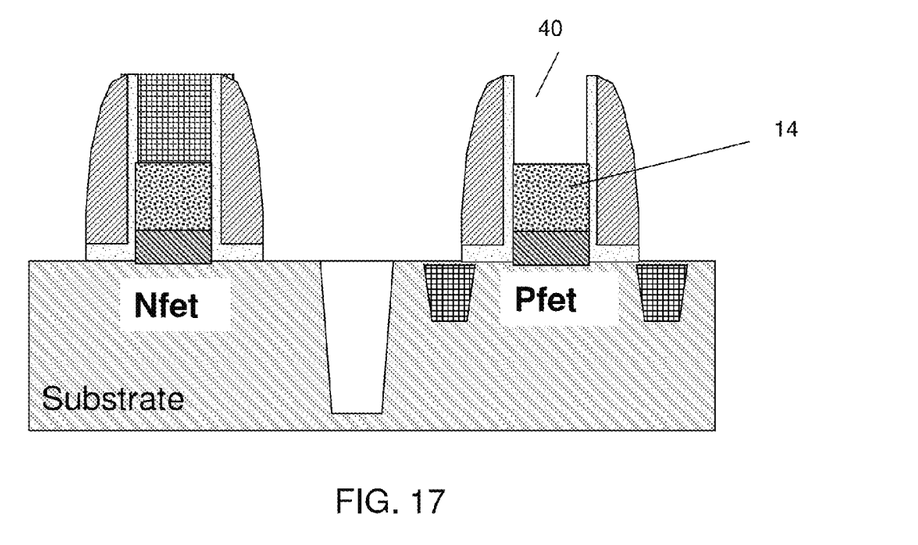

FIG. 17 shows the removal of the remaining oxide layer about the NFET and on the polysilicon 14 of the PFET stack. The removal of the oxide layer on the PFET stack results in a recess 40.

Figure 18:
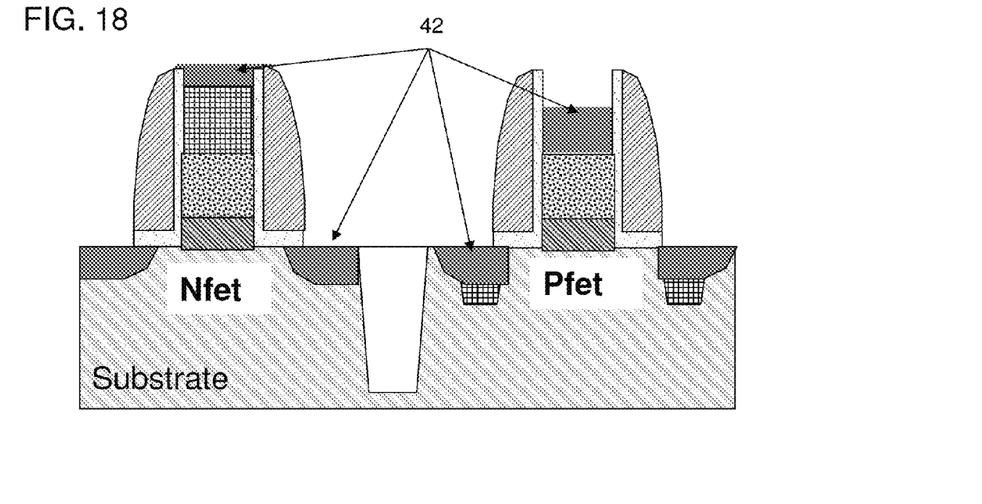

As representatively shown in FIG. 18, a silicidation process is performed, e.g., a high temperature anneal, over the structure of FIG. 17 to form silicide 42. In embodiments, the silicide 42 is formed in the source and drain regions of the NFET and the PFET. In addition, the silicide 42 is formed on the NFET and PFET stacks.

Figure 19:
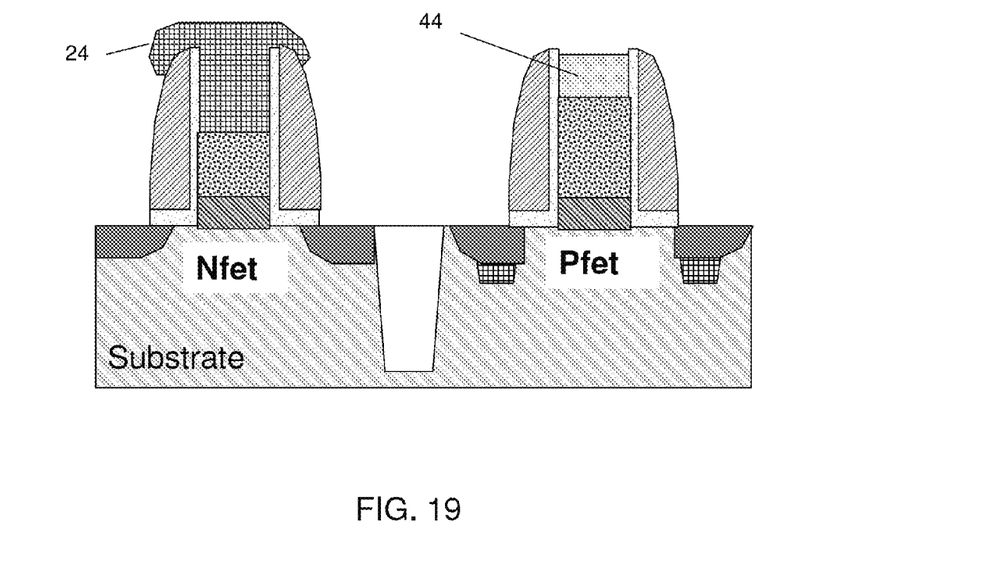

In FIG. 19, the silicide and SiGe layer are removed from the NFET stack to form a recess (not shown), and the silicide layer is removed from the PFET stack. An epitaxially grown strain material 24 is provided in the recess formed in the NFET stack (similar to that shown in FIGS. 7 and 8). As disclosed above, the strain material 24 can extend above the structure; although, in embodiments, the strain material 24 is preferably planar or substantially planar with the surface of the structure. In embodiments, the strain material 24 can be an SiGe material to provide a tensile strain for an NFET device (in the manner disclosed above). An oxide cap 44 is formed on the remaining portion of the PFET stack in a conventional manner, which should be known to those of skill in the art.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A method of forming a semiconductor structure comprising:
   forming sidewalls and spacers adjacent to a gate stack structure;
   forming a recess in the gate stack structure;
   epitaxially growing a straining material in an unrelaxed state on a polysilicon layer of the gate stack structure, and in the recess in the gate stack structure; and
   relaxing the epitaxially-grown straining material such that a lattice constant of the straining material changes to become an intrinsic lattice constant of Si:C that is smaller than a lattice constant of the polysilicon layer, wherein:
   the straining material is Si:C and the gate stack structure is a PFET gate stack structure, and
   the straining material is grown above and covering a top surface of the sidewalls and the spacers.

2. The method of claim 1, further comprising forming a gate oxide layer on a wafer of the semiconductor structure.

3. The method of claim 2, further comprising forming the polysilicon layer on the gate oxide layer.

4. The method of claim 3, further comprising patterning the gate oxide layer, the polysilicon layer, and a SiGe layer to form the gate stack structure.

5. The method of claim 4, further comprising removing the SiGe layer from the gate stack structure to form the recess in the gate stack structure.

6. The method of claim 4, further comprising:
   forming a resist on the SiGe layer; and
   exposing one or more selective portions of the resist to form one or more openings in the resist.

7. The method of claim 6, further comprising patterning the gate oxide layer, the polysilicon layer, and the SiGe layer to form the gate stack structure based on the one or more openings.

8. The method of claim 1, wherein:
   the sidewalls are oxide; and
   the spacers are silicon nitride.

9. The method of claim 1, wherein the straining material is substantially planar above a surface of the semiconductor structure.

10. The method of claim 9, wherein the straining material extends laterally over and above the sidewalls and the spacers.

11. The method of claim 1, wherein the relaxing comprises a high temperature process.

12. The method of claim 1, wherein the relaxing generates a physical biaxial contraction to the polysilicon layer.

13. The method of claim 1, wherein the straining material extends 30-50 nm above the gate stack structure.

14. The method of claim 1, further comprising patterning the gate oxide layer, the polysilicon layer and a silicide layer to form the gate stack structure.

15. The method of claim 14, further comprising removing the silicide layer from the gate stack structure to form the recess in the gate stack structure.

16. The method of claim 1, wherein the relaxing includes heating the epitaxially-grown straining material.

17. The method of claim 1, wherein growing the straining material in the unrelaxed state is performed such that the straining material has a lattice constant that conforms to a lattice constant of the polysilicon layer.

* * * * *